US012322641B2

(12) United States Patent
Nordin et al.

(10) Patent No.: US 12,322,641 B2
(45) Date of Patent: Jun. 3, 2025

(54) MECHANICAL INDEXER FOR MULTI-STATION PROCESS MODULE

(71) Applicant: Lam Research Corporation, Fremont, CA (US)

(72) Inventors: Michael Nordin, San Jose, CA (US); Karl Frederick Leeser, West Linn, OR (US); Richard Blank, San Jose, CA (US); Robert Sculac, Lake Oswego, OR (US); Damien Martin Slevin, Salem, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 333 days.

(21) Appl. No.: 17/306,226

(22) Filed: May 3, 2021

(65) Prior Publication Data
US 2021/0320029 A1  Oct. 14, 2021

Related U.S. Application Data

(63) Continuation of application No. 15/868,347, filed on Jan. 11, 2018, now Pat. No. 11,024,531.
(Continued)

(51) Int. Cl.
*H01L 21/687* (2006.01)
*H01L 21/67* (2006.01)
*H01L 21/677* (2006.01)

(52) U.S. Cl.
CPC .. *H01L 21/68707* (2013.01); *H01L 21/67167* (2013.01); *H01L 21/6719* (2013.01); *H01L 21/67196* (2013.01); *H01L 21/67742* (2013.01)

(58) Field of Classification Search
None
See application file for complete search history.

(56) References Cited

U.S. PATENT DOCUMENTS 6,746,195 B2 * 6/2004 Shirai ............... H01L 21/67751
414/217
6,949,177 B2 * 9/2005 Jeong ............... H01L 21/67745
204/224 R
(Continued)

FOREIGN PATENT DOCUMENTS

AU  2002327249 A1  1/2003
CN  101091241 A  12/2007
(Continued)

OTHER PUBLICATIONS

European Search Report dated Jun. 15, 2018 corresponding to European Patent Application No. 18151863.0, 9 pages.
(Continued)

*Primary Examiner* — Michael S Lowe

(57) ABSTRACT

A process module for a substrate processing tool includes a plurality of processing stations each configured to perform a process on a substrate and a mechanical indexer arranged within the process module. The mechanical indexer includes a plurality of end effectors including at least a first end effector, a second end effector, and a third end effector. Each of the plurality of end effectors extends in a radial direction from a central axis of the mechanical indexer and is configured to rotate about the central axis within the process module. The mechanical indexer is configured to position each of the plurality of end effectors at any one of the plurality of processing stations within the process module. The mechanical indexer is configured to position more than one of the plurality of end effectors at a same one of the plurality of processing stations at a same time.

9 Claims, 9 Drawing Sheets

Related U.S. Application Data

(60) Provisional application No. 62/449,325, filed on Jan. 23, 2017.

(56) References Cited

U.S. PATENT DOCUMENTS

| | | | |
|---|---|---|---|
| 10,170,347 B2 * | 1/2019 | Fujino | H01L 21/67742 |
| 10,276,416 B2 * | 4/2019 | Kitahara | H01L 21/67781 |
| 11,024,531 B2 * | 6/2021 | Nordin | H01L 21/6719 |
| 2004/0013497 A1 | 1/2004 | Shira | |
| 2008/0175694 A1 | 7/2008 | Park et al. | |
| 2008/0219806 A1 | 9/2008 | van der Meulen et al. | |
| 2009/0245984 A1 | 10/2009 | Lenz | |
| 2010/0144077 A1 | 6/2010 | Yamazaki et al. | |
| 2010/0178146 A1 | 7/2010 | Kremerman et al. | |
| 2013/0039734 A1 | 2/2013 | Englhardt et al. | |
| 2013/0121798 A1 | 5/2013 | Hosek | |
| 2014/0286736 A1 | 9/2014 | Kremerman et al. | |
| 2015/0179489 A1 | 6/2015 | Hyon et al. | |
| 2015/0240360 A1 * | 8/2015 | Leeser | H01L 21/67196 118/723 R |

FOREIGN PATENT DOCUMENTS

| | | |
|---|---|---|
| CN | 101299415 A | 11/2008 |
| CN | 201901699 U | 7/2011 |
| CN | 104120389 A | 10/2014 |
| CN | 104733351 A | 6/2015 |
| CN | 104846337 A | 8/2015 |
| JP | H11163075 A | 6/1999 |
| JP | 2000174091 A | 6/2000 |
| JP | 2002.76091 A | 3/2002 |
| JP | 2008-513980 A | 5/2008 |
| JP | 2010507221 A | 3/2010 |
| JP | 2011-199121 A | 10/2011 |
| JP | 2017500755 A | 1/2017 |
| KR | 20070108004 A | 11/2007 |
| TW | I792531 B | 2/2023 |

OTHER PUBLICATIONS

First Office Action corresponding to Chinese Patent Application No. 201810062008.9 dated Apr. 14, 2021, 10 pages.
Chinese Office Action for Chinese Application No. 202111660638.4 dated Aug. 30, 2024.
Japanese Decision to Grant for Japanese Application No. 2022-165116 dated Jan. 10, 2024.
Japanese Office Action for Japan Application No. 2018-6824 dated Jan. 21, 2022.
Japanese Office Action for Japan Application No. 2018-6824 dated Jun. 14, 2022.
Korean Office Action for Korean Application No. 10-2018-0006162 dated Apr. 29, 2022.
Taiwanese Office Action for Taiwan Application No. 112101156 dated Oct. 23, 2023.

* cited by examiner

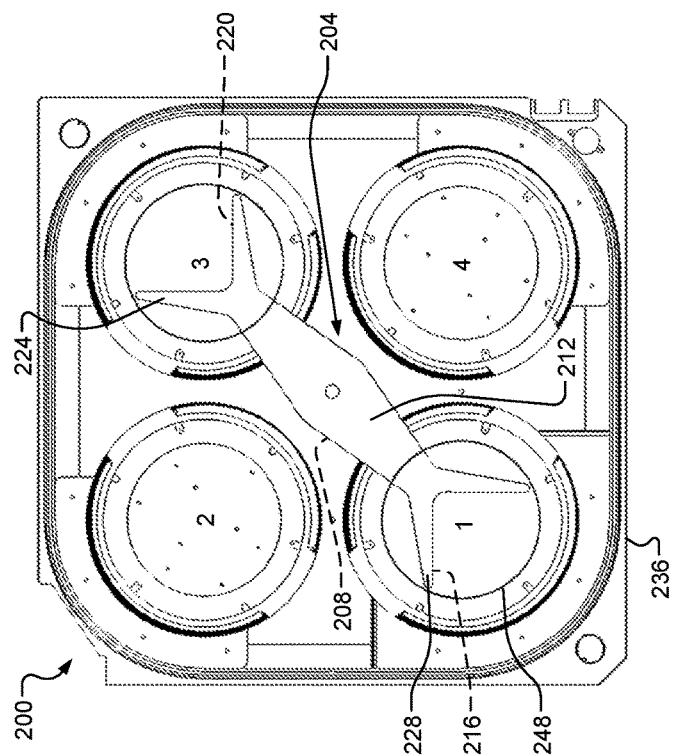
FIG. 2B
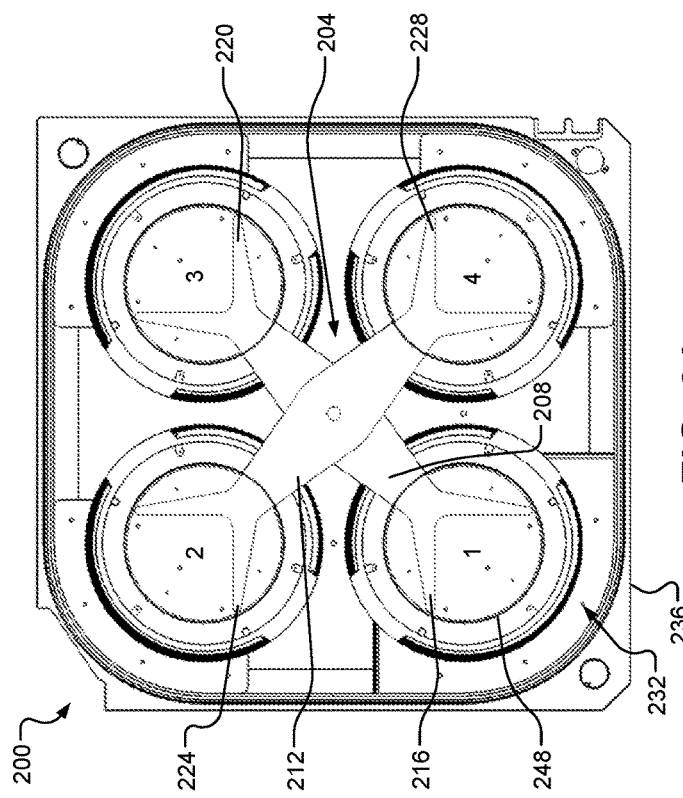
FIG. 2A
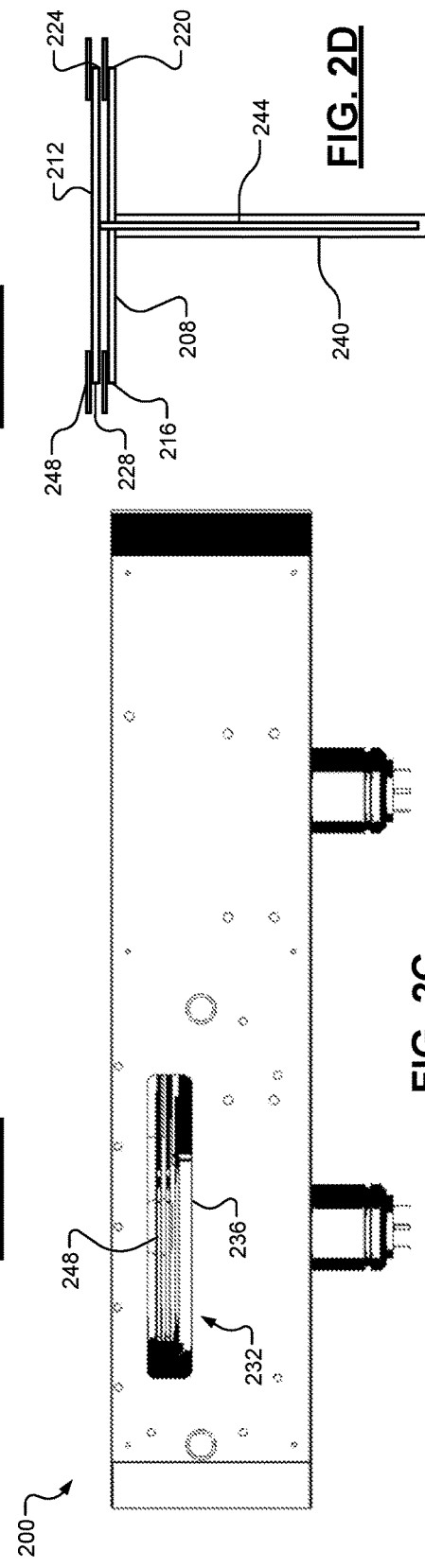
FIG. 2D
FIG. 2C

MECHANICAL INDEXER FOR MULTI-STATION PROCESS MODULE

CROSS-REFERENCE TO RELATED APPLICATIONS

The present disclosure is a continuation of U.S. patent application Ser. No. 15/868,347, filed on Jan. 11, 2018, which claims the benefit of U.S. Provisional Application No. 62/449,325, filed on Jan. 23, 2017. The entire disclosures of the applications referenced above are incorporated herein by reference.

FIELD

The present disclosure relates to transfer of substrates within process modules of substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system may be used to perform deposition, etching and/or other treatment of substrates such as semiconductor wafers. During processing, a substrate is arranged on a substrate support in a processing chamber of the substrate processing system. Gas mixtures including one or more precursors are introduced into the processing chamber and plasma may be struck to activate chemical reactions. The substrate processing system may include a plurality of substrate processing tools arranged within a fabrication room. Each of the substrate processing tools may include a plurality of process modules.

Referring now to FIG. 1, a top-down view of an example substrate processing tool 100 is shown. The substrate processing tool 100 includes a plurality of process modules 104. Each of the process modules 104 may be configured to perform one or more respective processes on a substrate. Substrates to be processed are loaded into the substrate processing tool 100 via ports of a load station of an equipment front end module (EFEM) 108 and then transferred into one or more of the process modules 104. For example, substrates may be transferred from the EFEM 108 to a load lock 112 via one or more EFEM robots 116. A vacuum transfer module (VTM) 120 includes one or more VTM robots 124 configured to transfer the substrates into and out of the process modules 104. For example, a substrate may be loaded into each of the process modules 104 in succession.

In one example, the process modules 104 correspond to quad station process modules (QSMs). A QSM may include four processing stations 128 within a single chamber (i.e., within a process chamber 132 of the process module 104). Substrates 136 are loaded into the process module 104 via a load station 140. For example, substrates 136 are transferred between the VTM 120 and the load stations 140 via respective slots 144 between the VTM 120 and the process modules 104. A mechanical indexer 148 (i.e., an indexing mechanism) sequentially rotates the substrates 136 between the processing stations 128. As shown, the mechanical indexer 148 corresponds to a cross-shaped spindle. For example, the substrate 136 may be transferred from the VTM 120 to the processing station 128 corresponding to the load station 140 (labelled "1"), rotated sequentially between the processing stations 140 labelled "2," "3", and "4," and then returned to the load station 140 for removal from the process module 104. A system controller 152 may control various operations of the tool, including, but not limited to, operation of the robots 116 and 124, rotation of the indexers 148, etc.

SUMMARY

A mechanical indexer for a substrate processing tool includes first and second arms each having first and second end effectors. The first arm is configured to rotate on a first spindle to selectively position the first end effector of the first arm at a plurality of processing stations of the substrate processing tool and selectively position the second end effector of the first arm at the plurality of processing stations of the substrate processing tool. The second arm is configured to rotate on a second spindle to selectively position the first end effector of the second arm at the plurality of processing stations of the substrate processing tool and selectively position the second end effector of the second arm at the plurality of processing stations of the substrate processing tool. At least one of the plurality of processing stations corresponds to a load station of the substrate processing tool. The first arm is configured to rotate independently of the second arm such that the first end effector or the second end effector of the first arm is positioned at the load station while the first end effector or the second end effector of the second arm is positioned at the load station.

In other features, the first spindle and the second spindle are coaxial. Each of the first arm and the second arm is configured to be raised and lowered relative to the plurality of processing stations of the substrate processing tool. The second spindle is disposed within the first spindle.

In other features, the first arm and the second arm are rotatable into a first configuration. In the first configuration, the first end effector and the second end effector of the first arm are positioned at a first processing station and a third processing station, respectively, of the plurality of processing stations and the first end effector and the second end effector of the second arm are positioned at a second processing station and a fourth processing station, respectively, of the plurality of processing stations. The first arm and the second arm are rotatable into a second configuration. In the second configuration, the first end effector and the second end effector of the first arm are positioned at the first processing station and the third processing station, respectively, of the plurality of processing stations and the first end effector and the second end effector of the second arm are positioned at the third processing station and the first processing station, respectively, of the plurality of processing stations.

In other features, the first processing station corresponds to the load station of the substrate processing tool. The first processing station and the third processing station are arranged at opposite corners of the substrate processing tool and the second processing station and the fourth processing station are arranged at opposite corners of the substrate processing tool.

In other features, the first arm and the second arm are rotatable into a first configuration. In the first configuration, the first end effector and the second end effector of the first arm are positioned at a first processing station and a fourth processing station, respectively, of the plurality of processing stations and the first end effector and the second end effector of the second arm are positioned at a second processing station and a third processing station, respectively, of the plurality of processing stations. The first arm and the second arm are rotatable into a second configuration. In the second configuration, the first end effector and the second end effector of the first arm are positioned at the first processing station and the fourth processing station, respectively, of the plurality of processing stations and the first end effector and the second end effector of the second arm are positioned at the fourth processing station and the first processing station, respectively, of the plurality of processing stations.

In other features, the first processing station and the fourth processing station are arranged on a first side of the substrate processing tool and the second processing station and the third processing station are arranged on a second side of the substrate processing tool opposite the first side. The first processing station and the fourth processing station correspond to load stations of the substrate processing tool.

In other features, a substrate processing tool includes a vacuum transfer module and a plurality of process modules coupled to the vacuum transfer module. At least one of the plurality of process modules includes the mechanical indexer. The plurality of process modules includes first and second process modules coupled to a first side of the vacuum transfer module and third and fourth process modules coupled to a second side of the vacuum transfer module.

In other features, an adapter plate is arranged between the first side and the first and second process modules. The adapter plate includes a planar side configured to interface with the first side of the vacuum transfer module and an angled side configured to interface with the first and second process modules.

In other features, the first side and the second side of the vacuum transfer module are chamfered. An adapter plate is arranged between the first side and the first and second process modules. The adapter plate includes an angled side configured to interface with the first side of the vacuum transfer module and a planar side configured to interface with the first and second process modules.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2A shows a first example process module with a mechanical indexer in an X-shaped configuration.

FIG. 2B shows the first example process module with the mechanical indexer in a second configuration.

FIG. 2C is a side view of the first example process module.

FIG. 2D is a side view of the mechanical indexer.

FIG. 3A shows a second example process module with a mechanical indexer in an X-shaped configuration.

FIG. 3B shows the second example process module with the mechanical indexer in a second configuration.

FIG. 3C is a side view of the second example process module.

In the drawings, reference numbers may be reused to identify similar and/or identical elements.

DETAILED DESCRIPTION

Figure 1:
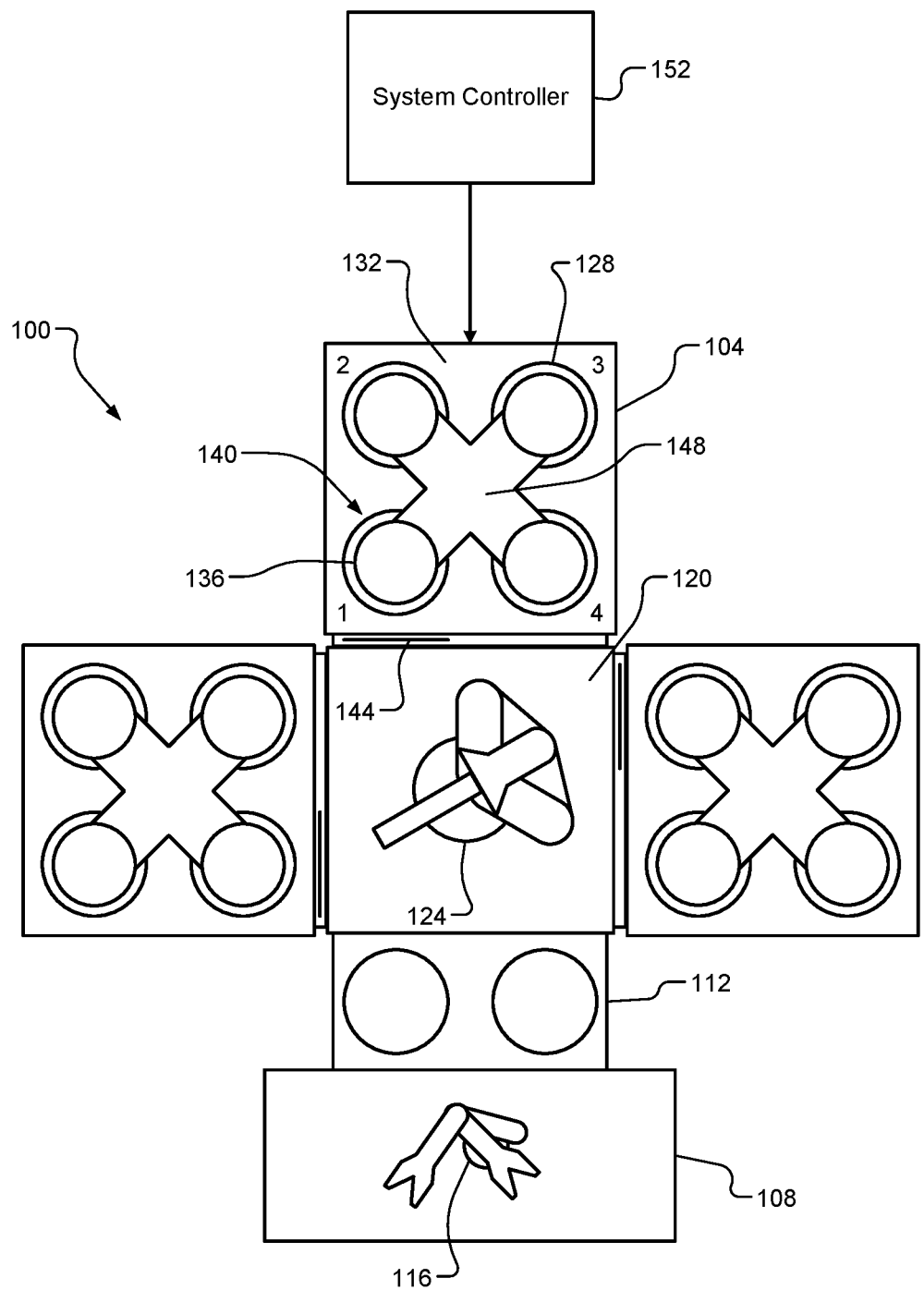
FIG. 1 is an example substrate processing tool.

Process modules in a substrate processing tool may be operated in a multiple station, sequential processing mode. For example, only a portion of the overall process may be performed on a substrate in each of the process stations in the process module. As process times in each of the stations decreases and/or the process module performs a greater number of processes on the substrate, delays associated with rotating and transferring the substrate via a mechanical indexer become a greater portion of a total time each substrate remains in the process module. In one example, substrates are sequentially transferred to the process station corresponding to the load station. The indexer is rotated subsequent to each transfer until a substrate is arranged on the indexer in each of the four process stations. Processing may then be performed on each of the substrates.

Substrate processing and transfer systems and methods according to the principles of the present disclosure implement a transfer module (e.g., a vacuum transfer module, or VTM), process module, and mechanical indexer configured to reduce substrate transfer times. For example, the VTM is configured to load two or more (e.g., four) substrates into the process module and to retrieve two or more substrates from the process module per transfer.

In one example, the mechanical indexer comprises two independently rotatable arms, each having first and second ends (e.g., end effectors). The indexer may be selectively arranged in a first, X-shaped configuration. In the X-shaped configuration, each of the ends may be aligned with a respective processing station in the process module. For example, first and second ends of a first arm may be aligned with diagonally opposite processing stations 1 and 3 (or 2 and 4) while first and second ends of a second arm may be aligned with diagonally opposite processing stations 2 and 4 (or 1 and 3). In a second configuration, one of the arms is raised and rotated such that the first arm and the second arm are aligned. In the second configuration, the first and second ends of each of the arms are aligned with stations 1 and 3 or 2 and 4. In other words, in the second configuration, respective ends of both arms may be vertically stacked in any one of the processing stations. In particular, respective ends of both arms may be aligned with the load station.

Accordingly, in this example, two substrates may be transferred to and/or from the process module (e.g., using a VTM robot having vertically stacked end effectors configured to transfer two substrates at a time). Both arms may be rotated such that opposite ends of each of the arms are aligned with the load station to transfer two additional substrates to and/or from the process module. The mechanical indexer may then be arranged into the first X-shaped configuration such that each of the four substrates is aligned with a different processing station.

In another example, the process module may include two load stations. For example, the load stations may correspond to processing stations adjacent to the VTM. In this example, the mechanical indexer includes first and second V-shaped arms. The indexer may be arranged in a first, X-shaped configuration. In the X-shaped configuration, first and second ends of the first V-shaped arm may be aligned with processing stations 1 and 4 (or processing stations 2 and 1, 3 and 2, or 4 and 3) while first and second ends of the second V-shaped arm may be aligned with processing stations 2 and 3 (or processing stations 3 and 4, 4 and 1, or 1 and 2). In a second configuration, one of the arms is raised and rotated such that the first arm and the second arm are aligned. In the second configuration, the first and second ends of each of the arms are aligned with, for example, stations 1 and 4, which may correspond to the load stations. In other words, in the second configuration, respective ends of both arms may be vertically stacked in the load stations.

Accordingly, in this example, four substrates may be transferred to and/or from the process module (e.g., using two VTM robots each having vertically stacked end effectors configured to transfer two substrates at a time). The mechanical indexer may then be arranged into the first X-shaped configuration such that each of the four substrates is aligned with a different processing station.

As described below in more detail, the substrate processing and transfer systems and methods according to the present disclosure may reduce energy consumption, reduce overhead time associated with substrate processing, increase processing throughput, increase the number of process modules per tool, etc. Although described with respect to process modules having four processing stations, the principles of the present disclosure may also be implemented in process modules having other numbers of processing stations (e.g., two, three, five, six, seven, eight, etc.).

Referring now to FIGS. 2A, 2B, 2C, and 2D an example process module 200 including a mechanical indexer 204 according to the principles of the present disclosure is shown. In this example, the mechanical indexer 204 comprises two independently rotatable arms 208 and 212, each having first and second ends (e.g., end effectors 216, 220, 224, and 228). The indexer 204 is arranged in a first, X-shaped configuration in FIG. 2A and a second configuration in FIG. 2B. In the X-shaped configuration, the end effectors 216 and 220 of the first arm 208 are positioned over processing stations 1 and 3, respectively, and the end effectors 224 and 228 are positioned over processing stations 2 and 4, respectively. The processing station 1 may correspond to a load station 232 accessible via slot 236.

In the second configuration, the second arm 212 may be raised and rotated such that the first arm 208 and the second arm 212 are aligned. For example, the first arm 208 may be coupled to a first spindle 240 and the second arm 212 may be coupled to a second spindle 244 as shown in FIG. 2D. The second spindle 244 is enclosed within the first spindle 240 and is configured to be selectively raised and lowered inside the first spindle 240. Accordingly, raising the second spindle 244 raises the second arm 212 relative to the first arm 208, allowing the second arm 212 to be rotated independently of the first arm 208. In this manner, the end effectors 216, 220, 224, and 228 and respective substrates 248 may be positioned above/below one another in the load station 232 or any one of the processing stations 1-4.

For example, the second arm 212 may be rotated such that the first arm 208 and the second arm 212 are arranged in the second configuration shown in FIG. 2B. In the second configuration, the end effectors 216 and 228 are each located in the load station 232. In other words, in the second configuration, the end effectors 216 and 228 are vertically stacked in the load station 232. Accordingly, the substrates 248 arranged on the end effectors 216 and 228 may be retrieved from the process module 200 and/or new (i.e., unprocessed) substrates may be loaded onto the end effectors 216 and 228 via the slot 236.

In one example transfer sequence, each of the first arm 208 and the second arm 212 are raised to a first elevation to lift the substrates 248 from the respective processing stations 1-4. For example, end effectors 216, 220, 224, and 228 may be positioned at processing stations 1, 2, 3, and 4, respectively. The second arm 212 may be further raised to a second elevation above the first elevation. Accordingly, the second arm 212 may be rotated (e.g., approximately 90 degrees in a clockwise direction as shown in FIG. 2B) such that the end effector 228 is positioned at processing station 1 (i.e., the load station 332). A VTM robot external to the process module 200 may then retrieve the substrates 248 arranged on each of the end effectors 216 and 228. In some examples, the VTM robot swaps the processed substrates 248 with unprocessed substrates.

Subsequent to unloading the substrates 248 and/or loading unprocessed substrates onto the end effectors 216 and 228, the entire indexer 204 (i.e., both the first arm 208 and the second arm 212) may be rotated approximately 180 degrees while maintaining the respective first and second elevations of the first arm 208 and the second arm 212. Accordingly, the indexer 204 is rotated such that end effectors 220 and 224 are positioned at the loading station 232. The VTM robot may then retrieve the processed substrates 248 from the end effectors 220 and 224 and/or load unprocessed substrates onto the end effectors 220 and 224. The second arm 212 may then be rotated (e.g., approximately 90 degrees in the clockwise direction) relative to the arm 208 to position the end effectors 224 and 228 at processing stations 2 and 4, respectively while the end effectors 216 and 220 remain at processing stations 3 and 1, respectively. Each of the first arm 208 and the second arm 212 may then be lowered to position the unprocessed substrates in the respective processing stations 1-4. Other example transfer sequences may be implemented.

Referring now to FIGS. 3A, 3B, 3C, 3D, and 3E, another example process module 300 including a mechanical indexer 304 according to the principles of the present disclosure is shown. In this example, the process module 300 includes two load stations 308 and 312 and corresponding slots 316 and 320. The indexer 304 includes first and second V-shaped arms 324 and 328 each having first and second ends (e.g., end effectors 332, 336, 340, and 344). The indexer 304 is arranged in a first, X-shaped configuration in FIGS. 3A and 3D and a second configuration in FIGS. 3B and 3E. In the X-shaped configuration, the end effectors 332 and 336 are position over processing stations 1 and 4, respectively, and the end effectors 340 and 344 are positioned over processing stations 2 and 3, respectively. The processing stations 1 and 4 correspond to the load stations 308 and 320, respectively.

In the second configuration, the second arm 328 may be raised and rotated such that the first arm 324 and the second arm 328 are aligned. For example, the first arm 324 and the second arm 328 may be coupled to independently rotatable spindles 348 and 352 configured to operates in a manner analogous to the first and second spindles 240 and 244 as described in FIG. 2D. Accordingly, the second arm 328 may be rotated such that the first arm 324 and the second arm 328 are arranged in the second configuration shown in FIG. 3B. In the second configuration, the end effectors 332 and 344 are each located in the load station 308 and the end effectors 336 and 340 are each located in the load station 312. For example, the end effectors 332 and 344 and corresponding substrates 356 arranged thereon are vertically stacked in the load station 308. Conversely, the end effectors 336 and 340 and the corresponding substrates 356 arranged thereon are vertically stacked in the load station 312. Accordingly, the substrates 356 may be retrieved from the process module 300 and/or new (i.e., unprocessed) substrates may be loaded onto the end effectors 332, 344 and 336, 340 via respective slots 316 and 320.

Figures 3A, 3B, 3C:
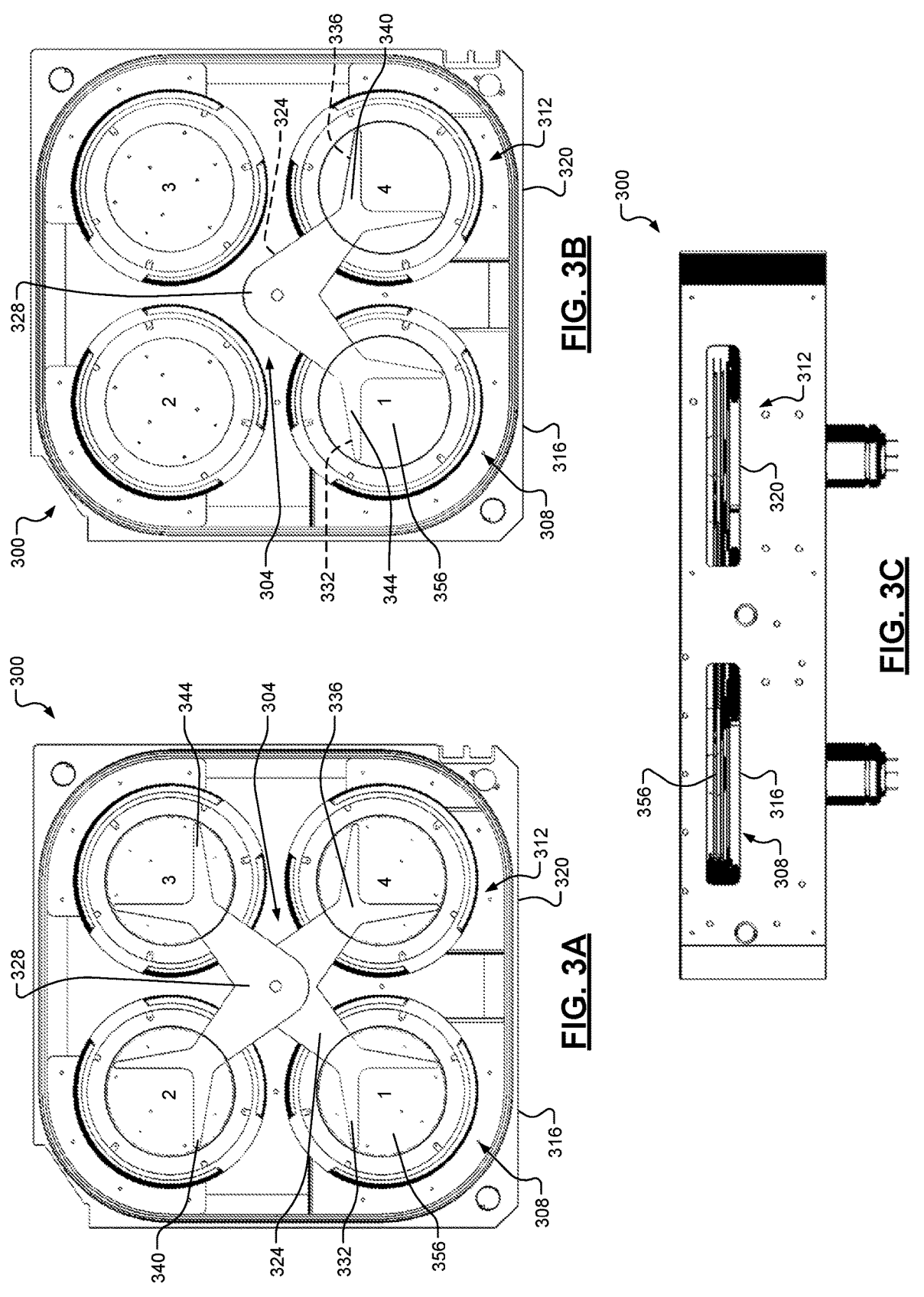

In one example transfer sequence, each of the first arm 324 and the second arm 328 are raised to a first elevation to lift the substrates 356 from the respective processing stations 1-4. For example, end effectors 332, 340, 344, and 336 may be positioned at processing stations 1, 2, 3, and 4, respectively. The second arm 328 may be further raised to a second elevation above the first elevation. Accordingly, the second arm 328 may be rotated (e.g., approximately 180 degrees as shown in FIG. 3B) such that the end effectors 344 and 340 are positioned at processing stations 1 and 2, respectively (i.e., the load stations 308 and 312). A VTM robot external to the process module 300 may then retrieve the substrates 356 arranged on each of the end effectors 332, 340, 344, and 336. In some examples, the VTM robot swaps the processed substrates 356 with unprocessed substrates.

Subsequent to unloading the substrates 356 and/or loading unprocessed substrates onto the end effectors 332, 340, 344, and 336, the second arm 328 is rotated approximately 180 degrees to return the indexer 304 to the X-shaped configuration while maintaining the respective first and second elevations of the first arm 324 and the second arm 328. Accordingly, the end effectors 332, 340, 344, and 336 are positioned at the processing stations 1, 2, 3, and 4, respectively. The first arm 324 and the second arm 328 may then be lowered onto the respective processing stations 1-4. Other example transfer sequences may be implemented.

Figure 4B:
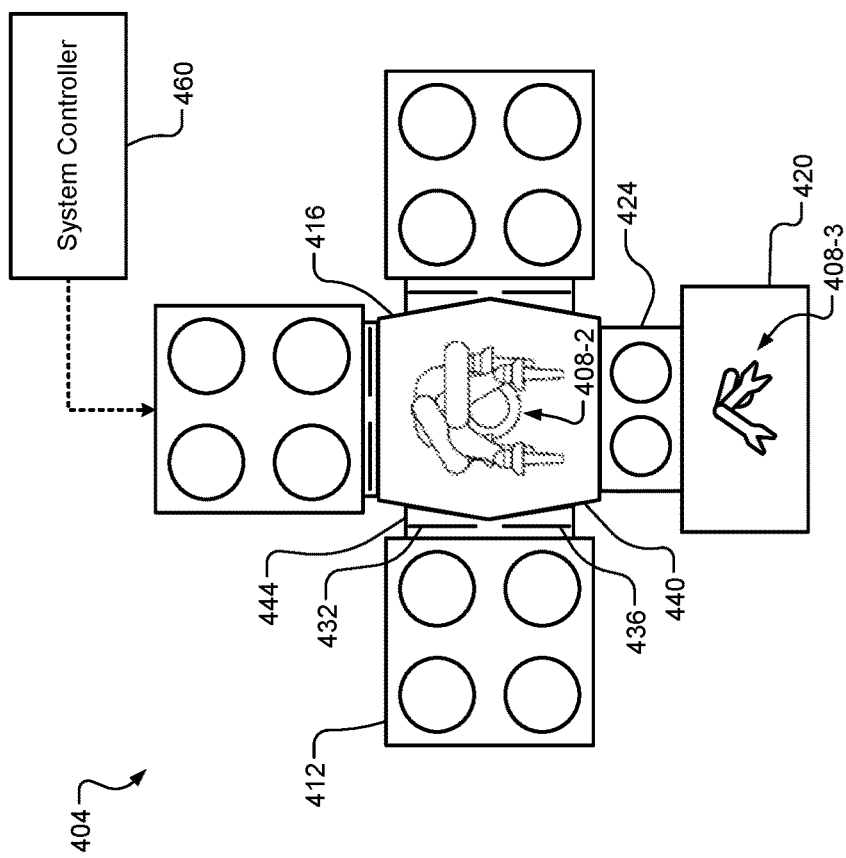
FIG. 4B shows a second example substrate processing tool.
Figure 4A:
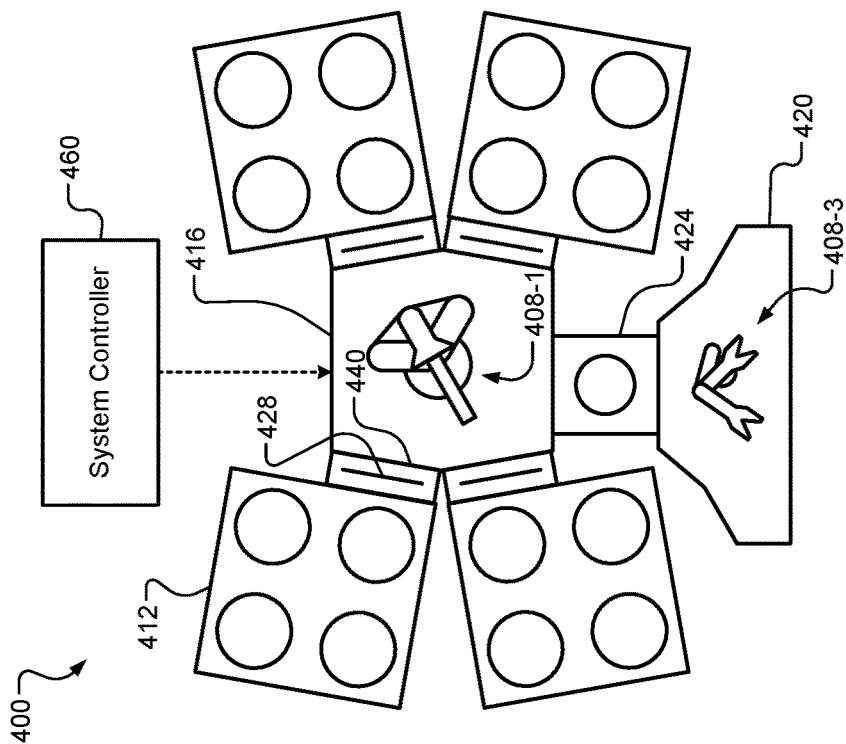
FIG. 4A shows a first example substrate processing tool.
Figure 4C:
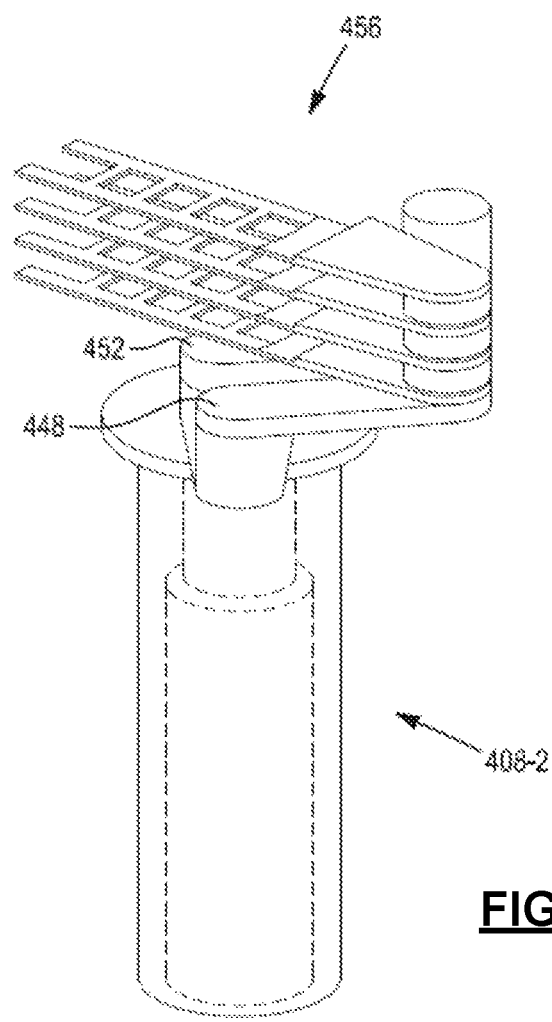
FIG. 4C shows an example transfer robot.

Referring now to FIGS. 4A, 4B, and 4C, top-down views of example substrate processing tools 400 and 404 having example transfer robots 408-1, 408-2, and 408-3, referred to collectively as transfer robots 408, are shown. The processing tools 400 and 404 are shown without mechanical indexers for example purposes. For example, respective process modules 412 of each of the tools 400 and 404 may include either of the mechanical indexer 204 and the mechanical indexer 304 as described above.

A vacuum transfer module (VTM) 416 and an equipment front end module (EFEM) 420 may each include one of the transfer robots 408. The transfer robots 408-1 and 408-2 may have the same or different configurations. For example only, the transfer robot 408-1 includes a single arm having two vertically stacked end effectors. Conversely, the transfer robot 408-2 is shown having two arms, each having two vertically stacked end effectors as shown in FIG. 4C. The robot 408 of the VTM 416 selectively transfers substrates to and from a load lock 424 and between the process modules 412. The robot 408-3 of the EFEM 420 transfers substrates into and out of the EFEM 420 and to and from the load lock 424. For example only, the robot 408-3 may have two arms each having a single end effector or two vertically stacked end effectors.

The tool 400 is configured to interface with, for example, four of the process modules 412 each having a single load station accessible via a respective slot 428. Conversely, the tool 404 is configured to interface with three of the process modules 412 each having two load stations accessible via respective slots 432 and 436. As shown, sides 440 of the VTM 416 may be angled (e.g., chamfered) to facilitate coupling with different arrangements (e.g., different amounts, spacing, etc.) of the process modules 412.

For example, as shown in FIG. 4A, the VTM is coupled to two of the process modules 412 per side 440. Conversely, the shape of the VTM 416 also allows for the connection of process modules 412 having two load stations. For example, an adapter plate 444 having the two slots 432 and 436 may be provided to accommodate a single process module 412 having two load stations as shown in FIG. 4B. As shown, the adapter plate 444 has a first, angled side configured to interface with the angled side 440 of the VTM 416 and a second, non-angled (i.e., straight or flat) side configured to interface with the process module 412. Accordingly, the VTM 416 provides the flexibility of allowing connection of a greater number of process modules 412 having a single load station (i.e., to increase the number of process stations per unit area of the tool 400) while also allowing the flexibility of using process modules 412 having only one load station as shown in FIG. 4A or two load stations as shown in FIG. 4B. In other examples, sides of the VTM 416 may be non-angled (i.e., straight or flat). In these examples, the tool 400 may include an adapter plate 446, as shown in FIG. 4D, configured to interface with two process modules 412 each having a single load station. In other words, instead of converting the angled side 440 of the VTM 416 to a non-angled side, the adapter plate 446 converts a non-angled side of the VTM 416 to an angled side.

The robot 408-2 of the VTM 416 includes two arms 448 and 452 each including two vertically stacked end effectors 456 for a total of four of the end effectors 456. Accordingly, each of the arms 448 and 452 is configured to simultaneously transfer two substrates to and/or from a respective one of the process modules 412, the load lock 424, etc. In the example shown in FIG. 4A, the robot 408-1 may retrieve two substrates from the process module 412 and load two substrates into the process module 412 in a given transfer. Conversely, the robot 408-2 may retrieve four substrates from the process module 412 and load four substrates into the process module 412 in a given transfer.

A system controller 460 may control various operations of the substrate processing tools 400 and 404, including, but not limited to, operation of the robots 408, rotation of the respective indexers of the process modules 412 (e.g., corresponding to the indexers 204 and 304 of FIGS. 2 and 3), etc.

Figure 4E:
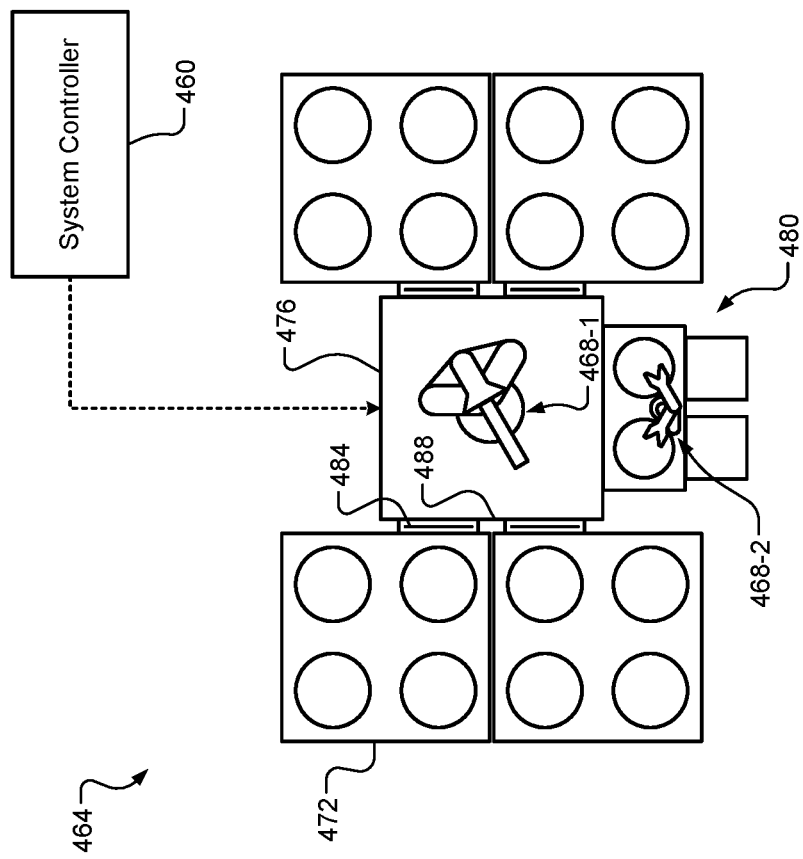
FIG. 4E shows a third example substrate processing tool.
Figure 4D:
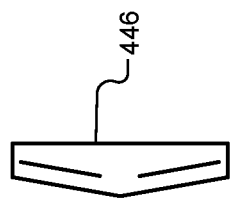
FIG. 4D shows an example adapter plate for a substrate processing tool.

In another example shown in FIG. 4E, a substrate processing tool 464 includes transfer robots 468-1 and 468-2, referred to collectively as transfer robots 468. The processing tool 464 is shown without mechanical indexers for example purposes. For example, respective process modules 472 of the tool 464 may include either of the mechanical indexer 204 and the mechanical indexer 304 as described above.

A VTM 476 and an EFEM 480 may each include one of the transfer robots 468. The transfer robots 468-1 and 468-2 may have the same or different configurations. For example only, the transfer robot 468-1 is shown having two arms, each having two vertically stacked end effectors as shown in FIG. 4C. The robot 468-1 of the VTM 476 selectively transfers substrates to and from the EFEM 480 and between the process modules 472. The robot 468-2 of the EFEM 480 transfers substrates into and out of the EFEM 480. For example only, the robot 468-2 may have two arms each having a single end effector or two vertically stacked end effectors.

The tool 464 is configured to interface with, for example, four of the process modules 472 each having a single load station accessible via a respective slot 484. In this example, sides 488 of the VTM 476 are not angled (i.e., the sides 488 are substantially straight or planar). In this manner, two of the process modules 472, each having a single load station, may be coupled to each of the sides 488 of the VTM 476. Accordingly, the EFEM 480 may be arranged at least partially between two of the process modules 472 to reduce a footprint of the tool 464.

Figure 5:
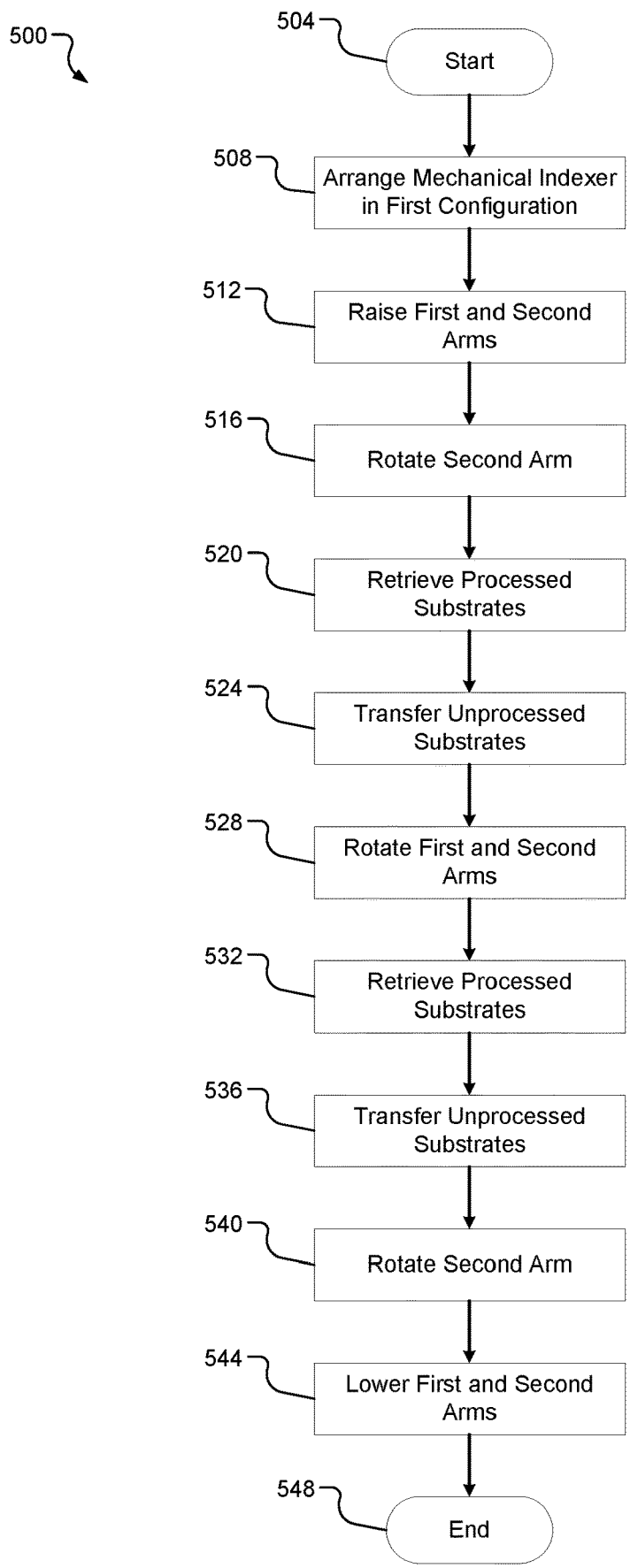
FIG. 5 shows steps of a first example method for operating a mechanical indexer of a substrate processing tool.

Referring now to FIG. 5, a first example method 500 for operating a mechanical indexer of a substrate processing tool begins at 504 (e.g., the mechanical indexer 204 as shown in FIGS. 2A, 2B, 2C, and 2D). For example only, operation of the mechanical indexer may be controlled by a controller, such as the system controller 460. At 508, the mechanical indexer is arranged in a first, X-shaped configuration where first and second ends of a first arm are positioned at first and third processing stations and first and second ends of a second arm are positioned at second and fourth processing stations (e.g., as shown in FIG. 2A). Each of the ends of the first and second arms may be positioned to retrieve a respective processed substrate. At 512, the first arm and the second arm are raised on respective spindles to lift the substrates from the processing stations. At 516, the second arm is rotated (e.g., 90 degrees in a clockwise direction as shown in FIG. 2B) such that the second end of the second arm is positioned at the first processing station, which may correspond to a load station. At 520, a robot retrieves the processed substrates from the first end of the first arm and the second end of the second arm positioned at the first processing station.

At 524, the robot transfers unprocessed substrates to the first end of the first arm and the second end of the second arm positioned at the first processing station. At 528, the first arm and the second arm are rotated (e.g., 180 degrees) such that the second end of the first arm and the first end of the second arm are each positioned at the first processing station. At 532, the robot retrieves the processed substrates from the first end of the first arm and the second end of the second arm. At 536, the robot transfers unprocessed substrates to the second end of the first arm and the first end of the second arm positioned at the first processing station. At 540, the second arm is rotated (e.g., 90 degrees in a clockwise direction) such that the first and second ends of the second arm are positioned at the second and fourth processing stations (i.e., the mechanical indexer is returned to the first, X-shaped configuration). At 544, the first and second arms are lowered to position the unprocessed substrates onto the respective processing stations. The method 500 ends at 548.

Figure 3D:
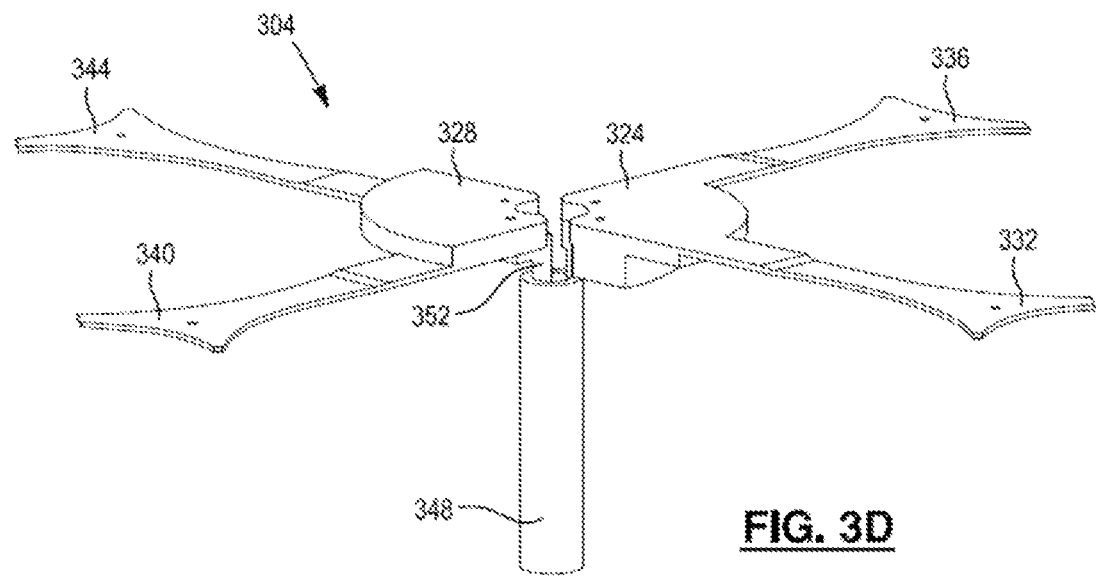
FIG. 3D shows the mechanical indexer in the X-shaped configuration.
Figure 3E:
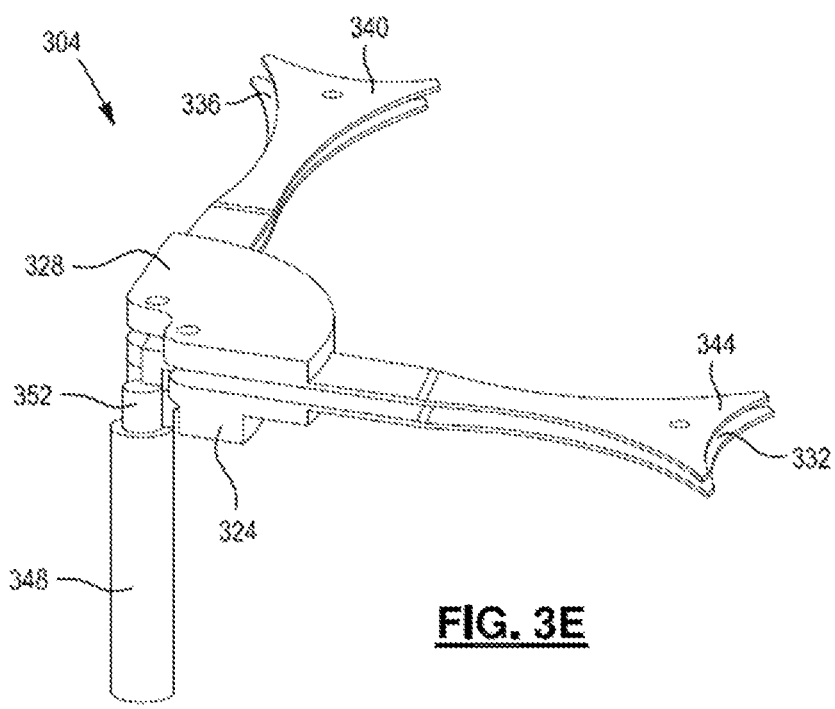
FIG. 3E shows the mechanical indexer in the second configuration.
Figure 6:
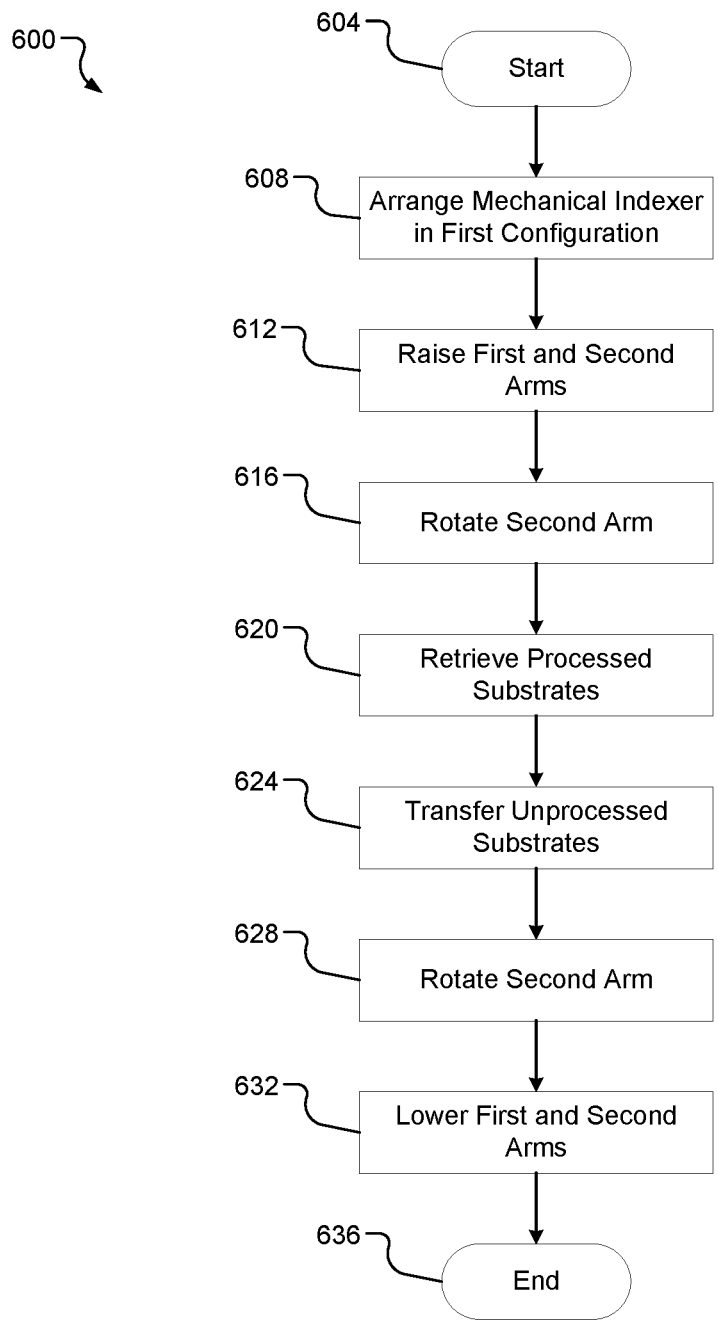
FIG. 6 shows steps of a second example method for operating a mechanical indexer of a substrate processing tool.

Referring now to FIG. 6, a second example method 600 for operating a mechanical indexer of a substrate processing tool begins at 604 (e.g., the mechanical indexer 304 as shown in FIGS. 3A, 3B, 3C, 3D, and 3E). For example only, operation of the mechanical indexer may be controlled by a controller, such as the system controller 460. At 608, the mechanical indexer is arranged in a first, X-shaped configuration where first and second ends of a first arm are positioned at first and fourth processing stations and first and second ends of a second arm are positioned at second and third processing stations (e.g., as shown in FIG. 3A). Each of the ends of the first and second arms may be positioned to retrieve a respective processed substrate. At 612, the first arm and the second arm are raised on respective spindles to lift the substrates from the processing stations. At 616, the second arm is rotated (e.g., 180 degrees in a clockwise direction as shown in FIG. 3B) such that the first and second ends of the second arm are positioned at the fourth and first processing stations, respectively, which may each correspond to a load station. At 620, one or more robots retrieve the processed substrates from the first and second ends of the first arm and the first and second ends of the second arm positioned at the first and fourth processing stations.

At 624, the robot transfers unprocessed substrates to the first and second ends of the first arm and the first and second ends of the second arm positioned at the first and fourth processing stations. At 628, the second arm is rotated (e.g., 180 degrees) such that the first and second ends of the second arm are positioned at the second and third processing stations (i.e., the mechanical indexer is returned to the first, X-shaped configuration). At 632, the first and second arms are lowered to position the unprocessed substrates onto the respective processing stations. The method 600 ends at 636.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A process module for a substrate processing tool, the process module comprising:
   a plurality of processing stations each configured to perform a process on a substrate; and
   a mechanical indexer arranged within the process module, wherein the mechanical indexer comprises a plurality of end effectors including at least a first end effector, a second end effector, and a third end effector, wherein each of the plurality of end effectors extends in a radial direction from a central axis of the mechanical indexer and is configured to rotate about the central axis within the process module,
   the mechanical indexer is configured to position each of the plurality of end effectors at any one of the plurality of processing stations within the process module, and
   the mechanical indexer is configured to position the first, second, and third end effectors at a same one of the plurality of processing stations at a same time.

2. The process module of claim 1, wherein the mechanical indexer is configured to position each of the plurality of end effectors at a loading station of the process module at a same time.

3. The process module of claim 1, wherein at least one of the plurality of processing stations is a load station of the process module.

4. The process module of claim 3, further comprising a first slot aligned with the load station, wherein the first slot provides access to the load station from a vacuum transfer module external to the process module.

5. The process module of claim 4, wherein the mechanical indexer is configured to receive at least two substrates through the first slot at a same time.

6. The process module of claim 3, wherein two of the plurality of processing stations are load stations of the process module, the process module further comprising:
   a first slot aligned with a first one of the load stations, wherein the first slot provides access to the first one of the load stations from a vacuum transfer module external to the process module; and
   a second slot aligned with a second one of the load stations, wherein the second slot provides access to the second one of the load stations from the vacuum transfer module.

7. The process module of claim 6, wherein the mechanical indexer is configured to receive, at a same time, two substrates through the first slot and two substrates through the second slot.

8. The process module of claim 1, wherein a quantity of the plurality of end effectors and a quantity of the plurality of processing stations in the process module is the same.

9. The process module of claim 1, wherein the plurality of end effectors consists of the first end effector, the second end effector, the third end effector, and a fourth end effector and the plurality of processing stations consists of four processing stations.

* * * * *